(12) United States Patent
Toda et al.

(10) Patent No.: US 12,489,007 B2
(45) Date of Patent: Dec. 2, 2025

(54) SUBSTRATE STORAGE CONTAINER

(71) Applicant: Shin-Etsu Polymer Co., Ltd., Tokyo (JP)

(72) Inventors: Junya Toda, Saitama (JP); Takashi Suda, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 148 days.

(21) Appl. No.: 17/640,336

(22) PCT Filed: Aug. 7, 2020

(86) PCT No.: PCT/JP2020/030400
§ 371 (c)(1),
(2) Date: Mar. 4, 2022

(87) PCT Pub. No.: WO2021/044805
PCT Pub. Date: Mar. 11, 2021

(65) Prior Publication Data
US 2022/0344186 A1 Oct. 27, 2022

(30) Foreign Application Priority Data
Sep. 5, 2019 (JP) ................................. 2019-161860

(51) Int. Cl.
*H01L 21/673* (2006.01)
*H01L 21/677* (2006.01)

(52) U.S. Cl.
CPC .. *H01L 21/67386* (2013.01); *H01L 21/67383* (2013.01); *H01L 21/6773* (2013.01)

(58) Field of Classification Search
CPC ......... H01L 21/67386; H01L 21/67383; H01L 21/6773
USPC ........................................ 206/710–712, 454
See application file for complete search history.

(56) References Cited

U.S. PATENT DOCUMENTS 7,552,826 B2 * 6/2009 Watanabe .............. B65D 19/02
 24/457
9,362,152 B2 6/2016 Wada et al.
(Continued)

FOREIGN PATENT DOCUMENTS

CN 109314072 2/2019
JP 2004207750 7/2004
(Continued)

OTHER PUBLICATIONS

"International Search Report (Form PCT/ISA/210) of PCT/JP2020/030400," mailed on Sep. 24, 2020, with English translation thereof, pp. 1-4.

(Continued)

*Primary Examiner* — Robert Poon
(74) *Attorney, Agent, or Firm* — JCIP GLOBAL INC.

(57) ABSTRACT

According to one embodiment, a substrate storage container includes a transport component configured to be mountable to a container body by being relatively displaced with respect to the container body from the rear side to the front side. The container body has a container body-side protrusion protruding upward. The transport component has a transport component-side protrusion protruding downward. In a mounted state, the transport component-side protrusion is engaged with the front side of the container body-side protrusion to be restricted from being displaced backwards. When a predetermined load is applied to the transport component-side protrusion upwardly, the transport component-side protrusion is displaced by a smaller amount than the container body-side protrusion displaced when the predetermined load is applied to the container body-side protrusion downwardly.

11 Claims, 8 Drawing Sheets

(56) References Cited

U.S. PATENT DOCUMENTS

| | | | |
|---|---|---|---|
| 2004/0124118 A1 | 7/2004 | Matsutori et al. | |
| 2005/0109668 A1* | 5/2005 | Burns | H01L 21/67383 206/711 |
| 2009/0277816 A1 | 11/2009 | Aramaki | |
| 2011/0005966 A1* | 1/2011 | Chiu | H01L 21/67379 206/711 |
| 2012/0325707 A1* | 12/2012 | Ogawa | H01L 21/67379 206/454 |
| 2013/0146503 A1* | 6/2013 | Wang | H01L 21/67369 206/710 |
| 2015/0294887 A1* | 10/2015 | Burns | H01L 21/67396 206/711 |
| 2019/0189489 A1 | 6/2019 | Mimura et al. | |

FOREIGN PATENT DOCUMENTS

| | | |
|---|---|---|
| JP | 2004214269 | 7/2004 |
| JP | 2007302311 | 11/2007 |
| JP | 2009302414 | 12/2009 |
| JP | 2011181867 | 9/2011 |
| KR | 101698635 | 1/2017 |
| TW | 200415087 | 8/2004 |
| TW | 201217242 | 5/2012 |
| TW | 201323294 | 6/2013 |
| TW | 201507949 | 3/2015 |
| TW | 201812960 | 4/2018 |
| WO | 2011108424 | 9/2011 |
| WO | 2018034101 | 2/2018 |

OTHER PUBLICATIONS

"Written Opinion of the International Searching Authority (Form PCT/ISA/237)" of PCT/JP2020/030400, mailed on Sep. 24, 2020, with English translation thereof, pp. 1-8.

Office Action of Taiwan Counterpart Application, with English translation thereof, issued on Jan. 23, 2024, pp. 1-19.

* cited by examiner

SUBSTRATE STORAGE CONTAINER

CROSS-REFERENCE TO RELATED APPLICATION

This application is a 371 application of the International PCT application serial no. PCT/JP2020/030400, filed on Aug. 7, 2020, which claims the priority benefits of Japan Patent Application No. 2019-161860, filed on Sep. 5, 2019. The entirety of each of the above-mentioned patent applications is hereby incorporated by reference herein and made a part of this specification.

TECHNICAL FIELD

The present disclosure relates to a substrate storage container containing a transport component.

BACKGROUND ART

Substrates such as semiconductor wafers are stored in warehouse, transported between semiconductor processing machines or conveyed between factories while being stored in the interior space of a substrate storage container. The substrate storage container is equipped with a transport component on the ceiling surface of its container body such that automatic conveyors such as overhead traveling devices and robots can handle the substrate storage container.

For example, Patent Literature 1 discloses a substrate storage container that has: an attachment mechanism including, on the ceiling surface of the container body, a bifurcated portion formed by combining a guide piece and an interference engaging portion; and a transport component used for transportation having an elastic engagement piece that is detachably attached to the bifurcated portion.

CITATION LIST

Patent Literature

[Patent Literature 1] Japanese Unexamined Patent Application Publication No. 2011-181867

SUMMARY OF INVENTION

Technical Problem

However, in such attachment structure using the engagement of an elastic engagement piece as in Patent Literature 1, the transport component may become detached from the container body due to an impact caused by a sudden stop or movement during the transport of the substrate storage container. Also, it has been desired that the transport component be prevented from being easily detached from the container body during the handling by an operator.

Therefore, in one aspect, this disclosure provides a substrate storage container with increased mounting force of a transport component.

Solution to Problem

In one aspect of the disclosure, the following solutions are provided.

(1) A substrate storage container includes: a main body, and a transport component configured to be mountable to the main body by being relatively displaced with respect to the main body in a first direction from a second side to a first side. The main body has a first protrusion protruding to a third side in a second direction orthogonal to the first direction and a first engaging portion. The transport component has a second protrusion protruding to a fourth side opposite to the third side in the second direction and a second engaging portion. In a mounted state in which the transport component is mounted to the main body, the second engaging portion is engaged with the first engaging portion in the second direction to restrict a relative displacement between the main body and the transport component in the second direction. In the mounted state, the second protrusion is positioned on the first side of the first protrusion in the first direction and is engaged with the first protrusion in the first direction to restrict a relative displacement of the transport component with respect to the main body to the second side in the first direction. When a predetermined load is applied to the second protrusion toward the third side in the second direction, the second protrusion is displaced in the second direction by a smaller amount than the first protrusion displaced in the second direction when the predetermined load is applied to the first protrusion toward the fourth side in the second direction.

(2) In the configuration above, the first protrusion has a top portion on the third side and the second protrusion has a top portion on the fourth side. In the mounted state, the top portion of the first protrusion overlaps with the top portion of the second protrusion in an amount in a range of 1.5 mm to 3.5 mm. Note that, herein, a numerical range represented by $\alpha$ to $\beta$ represents a range of $\alpha$ or more and $\beta$ or less.

(3) In the configurations above, the first protrusion has a triangular shape whose apex is located on the third side as viewed in a third direction orthogonal to both of the first direction and the second direction. The top portion of the second protrusion has a triangular shape whose apex is located on the fourth side as viewed in the third direction.

(4) In the configurations above, the triangular shape of the first protrusion has a side on the second side forming an inclination angle with respect to the second direction larger than that of a side on the first side in the mounted state as viewed in the third direction. The triangular shape of the top portion of the second protrusion has a side on the first side forming an inclination angle with respect to the second direction larger than that of a side on the second side in the mounted state as viewed in the third direction.

(5) In the configurations above, the triangular shape of the top portion of the second protrusion has the side on the first side forming the inclination angle in a range of 60° to 80° in the mounted state as viewed in the third direction.

(6) In the configurations above, the triangular shape of the top portion of the second protrusion has the side on the second side forming the inclination angle in a range of 0° to 5° in the mounted state as viewed in the third direction.

(7) In the configurations above, the second protrusion has a base portion on the third side, and the base portion has inclinations with respect to the second direction as viewed in the third direction.

(8) In the configurations above, the inclinations of the base portion includes an inclination on the first side having an angle in a range of 40° to 50° with respect to the second direction; and an inclination on the second side having an angle in a range of 40° to 50° with respect to the second direction.

(9) In the configurations above, the base portion of the second protrusion has a hole recessed in the first direction or a through hole penetrating therethrough in the first direction.

(10) In the configurations above, the first protrusion has a height in a range of 6.5 mm to 10 mm.

(11) In the configurations above, the main body is configured such that when the predetermined load is applied to the first protrusion toward the fourth side in the second direction, an area around the first protrusion is elastically deformed to cause a displacement of the first protrusion in the second direction.

Advantageous Effects of Invention

In one aspect, the present disclosure provides a substrate storage container with increased mounting force of a transport component.

DESCRIPTION OF EMBODIMENTS

Hereinafter, embodiments of the present disclosure will be described in detail with reference to the drawings. Throughout the embodiments herein, the same members are denoted by the same reference numerals. In the figures, the front-rear direction of a substrate storage container of the disclosure is indicated as the X-axis direction (a first direction), the top-bottom direction is indicated as the Y-axis direction (a second direction), and the left-right direction orthogonal to the X-axis direction and the Y-axis direction is indicated as the Z-axis direction (a third direction).

[Substrate Storage Container]

Figure 1:
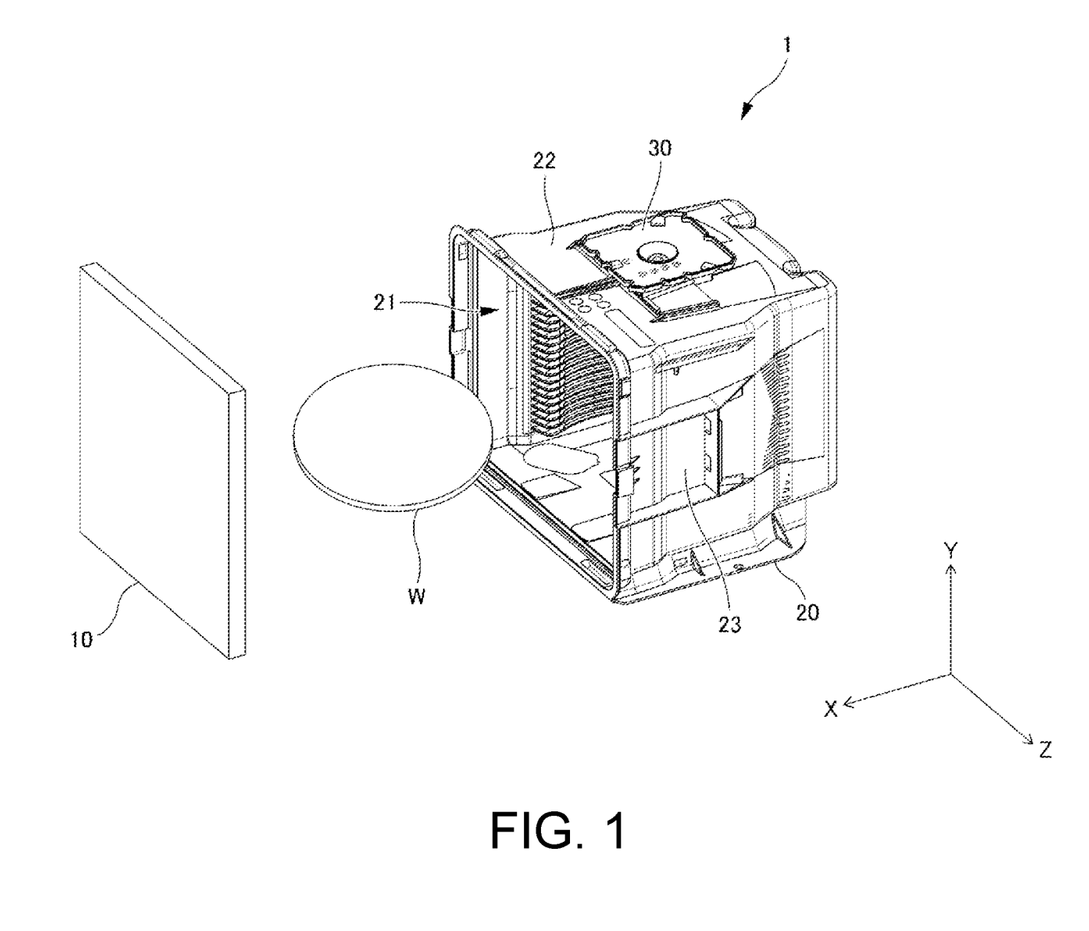
FIG. 1 is an exploded perspective view illustrating a substrate storage container according to an embodiment of the disclosure.
Figure 2:
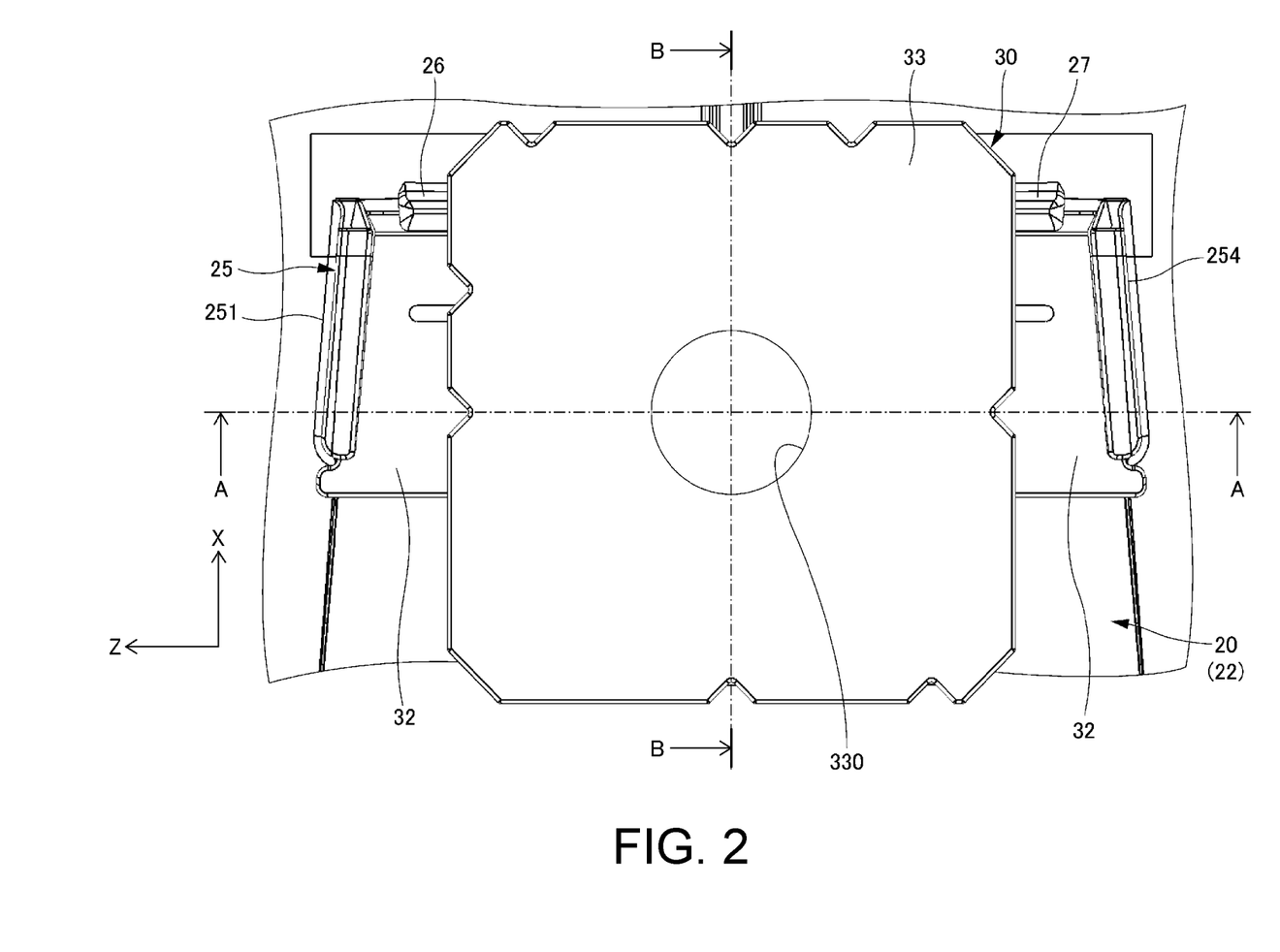
FIG. 2 is a plan view illustrating a part of the substrate storage container in which a transport component is mounted.

A substrate storage container of the disclosure will be described. FIG. 1 is an exploded perspective view illustrating a substrate storage container according to an embodiment of the disclosure. FIG. 2 is a plan view illustrating a part of the substrate storage container in which a transport component is mounted.

A substrate storage container 1 illustrated in FIG. 1 includes a lid 10 and a container body 20 (an example of a main body) for storing a plurality of substrates W. Examples of the substrates W stored in the substrate storage container 1 include semiconductor wafers and mask glass substrates with a diameter of 300 mm or 450 mm.

The container body 20 is of the so-called front-open box type formed by a front open frame forming an opening 21, a rear surface, right and left side surfaces 23, a top surface 22, and a bottom surface. The opening 21 of the container body 20 is closed by the lid 10. On the top surface 22 of the container body 20, a below-described transport component 30 is mounted.

The lid 10 and the container body 20 are composed of a plurality of parts that are formed by injection molding using a molding material containing a predetermined resin and assembled together. Examples of the predetermined resin in the molding material include polycarbonate, polyether ether ketone, polyetherimide, polybutylene terephthalate, polyacetal, liquid crystal polymer, cyclic olefin resin and the like excellent in mechanical properties, heat resistance and the like. In addition, carbon, metallic fibers, conductive polymers, antistatic agents, flame retardants or the like may be selectively added to these resins as necessary.

[Transport Component]

Figure 3:
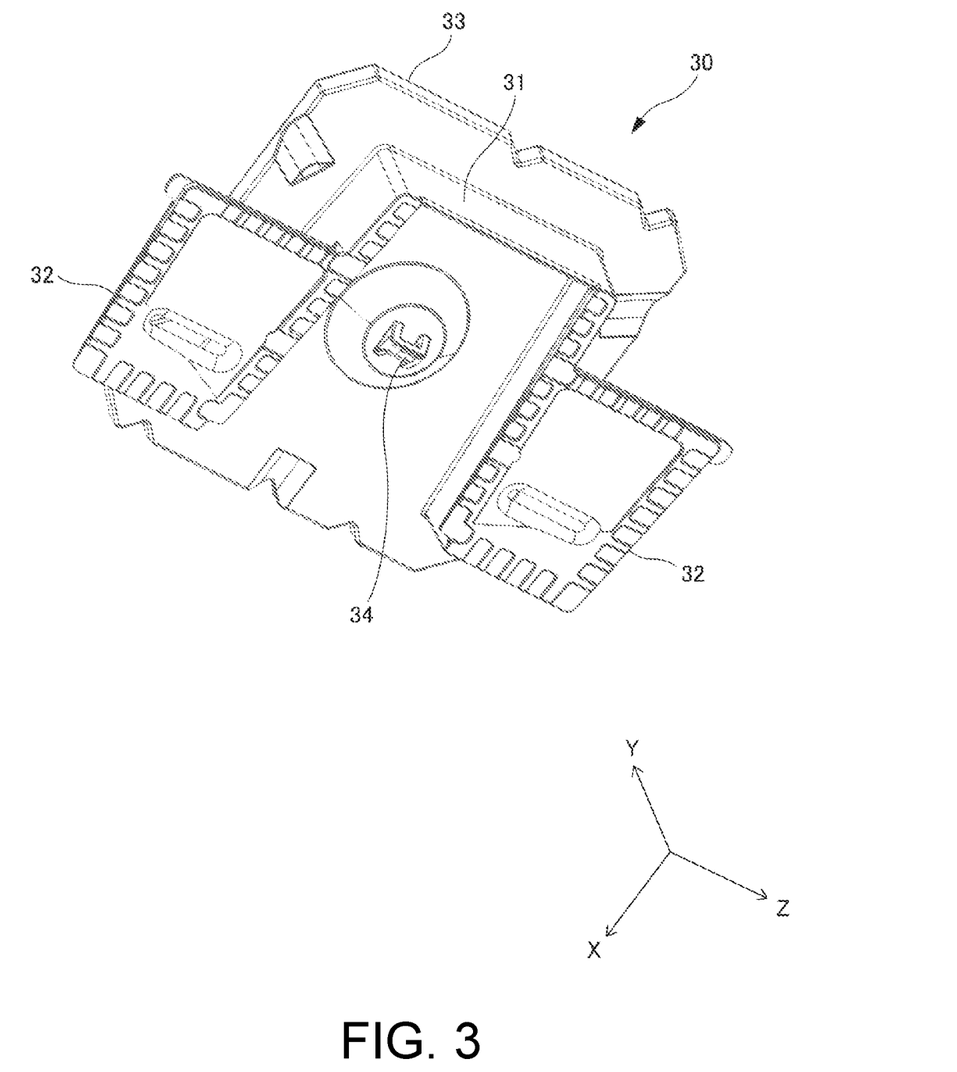
FIG. 3 is a perspective view illustrating the transport component as viewed from below.
Figure 4:
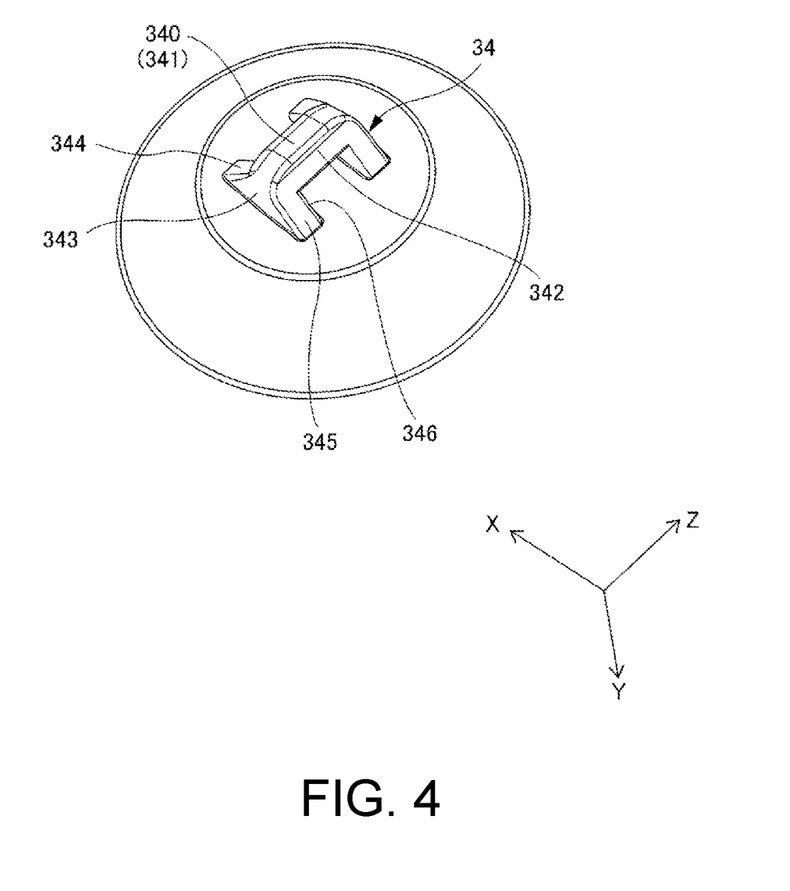
FIG. 4 is a perspective view illustrating a transport component-side protrusion of the transport component.
Figure 5:
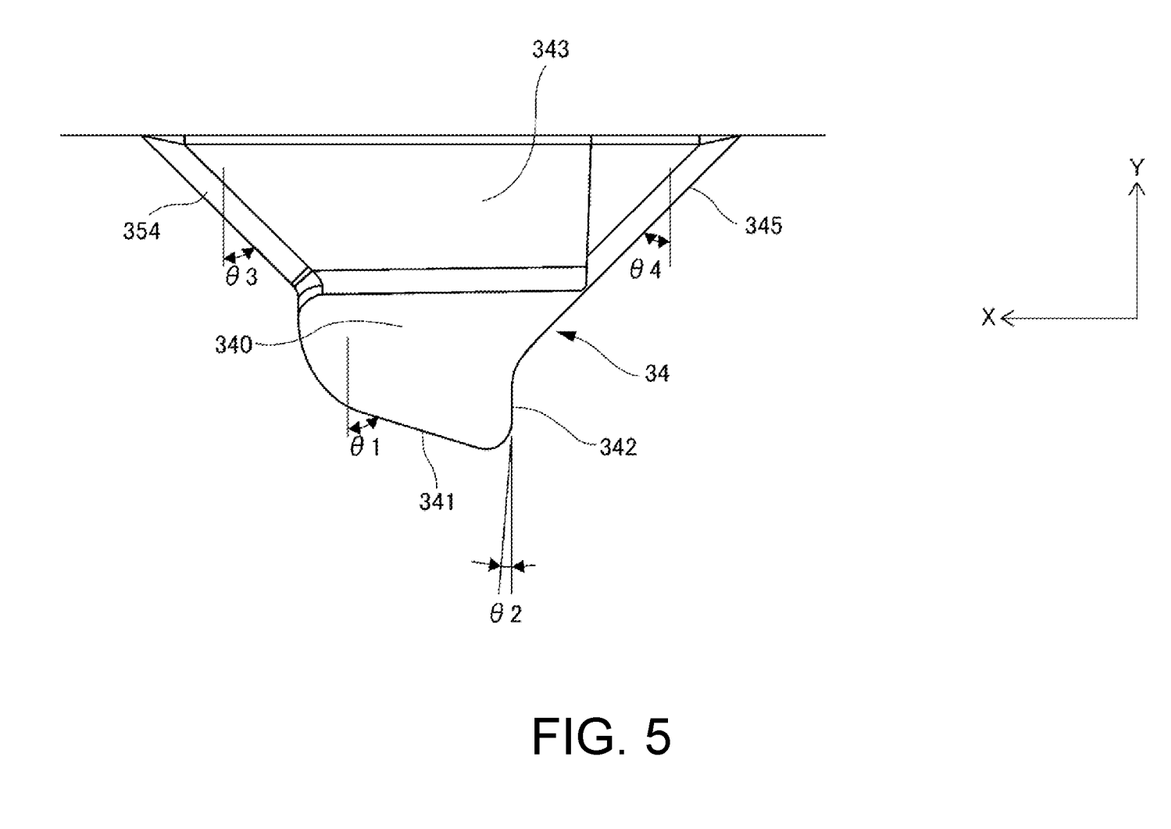
FIG. 5 is a side view illustrating the transport component-side protrusion of the transport component.

A transport component will be described. FIG. 3 is a perspective view illustrating the transport component as viewed from below. FIG. 4 is a perspective view illustrating a second protrusion of the transport component. FIG. 5 is a side view illustrating the second protrusion of the transport component.

The transport component 30 illustrated in FIG. 3 is mounted at a substantially center portion on the top surface 22 of the container body 20. The transport component 30, also referred to as a robotic flange, is held and transported by, for example, a ceiling transportation device while being mounted to the container body 20. The transport component 30 is formed of the same molding material as the lid 10 and the container body 20 from the viewpoint of securely supporting the substrate storage container 1 storing the storage substrates W.

The transport component 30 includes a component main body 31 in a substantially hollow frame shape in plan view. On both sides of a lower end of the component main body 31, a pair of left and right held plate 32 (an example of a second engaging portion) extends horizontally. On the other hand, on an upper open end of the component main body 31, a flange 33 that is held by a ceiling transportation device is integrally formed.

The pair of left and right held plates 32 is formed in a flat plate shape so as to overlap with the top surface 22 of the container body 20. Outer side surfaces thereof are inclined so as to be closer with each other on the front side of the container body 20.

The flange 33 is formed in a shape of a planar rectangle with four chamfered corners, and has a concave portion 330 formed at a central portion on its top surface. The concave portion is used for sensing or positioning by the ceiling transportation device.

At a central portion of an undersurface of the flange 33 in an area surrounded by the component main body 31, a transport component-side protrusion 34 protruding downward (an example of a second protrusion) is formed. A top portion 340 of the transport component-side protrusion 34 on the lower side has a triangular shape whose apex is located on the lower side as viewed in the left-right direction. In the triangular shape of the top portion 340 of the transport component-side protrusion 34, a side 341 on the front side has an inclination angle with respect to the top-bottom direction larger than that of a side 342 on the rear side as viewed in the left-right direction in a mounted state in which the transport component 30 is mounted to the container body 20. For example, an inclination angle θ1 of the side 341 on the front side with respect to the top-bottom direction is in the range of 60° to 80°, and an inclination angle θ2 of the side 342 on the rear side with respect to the top-bottom direction is in the range of 0° to 5°. The reason thereof will be described later.

A base portion 343 of the transport component-side protrusion 34 on the upper side has inclinations with respect to the top-bottom direction as viewed in the left-right direction. For example, a surface 354 of the base portion 343 on the front side forms an inclination angle θ3 in the range of 40° to 50° with respect to the top-bottom direction, and a surface 345 of the base portion 343 on the rear side forms an angle θ4 in the range of 40° to 50° with respect to the top-bottom direction, as viewed in the left-right direction. That is, the base portion 343 has a trapezoidal shape whose width in the front-rear direction becomes wider toward the upper side as viewed in the left-right direction.

The base portion 343 has a through hole 346 penetrating therethrough in the front-rear direction. Such through hole 346 prevents defects in appearance such as sinks and voids in the molding process to improve the moldability of the transport component 30 and prevents cleaning liquid from remaining after cleaning. The base portion 343 may have a hole recessed in the front-rear direction as an alternative to the through hole 346.

[Transport Component-Mounting Section]

Figure 6:
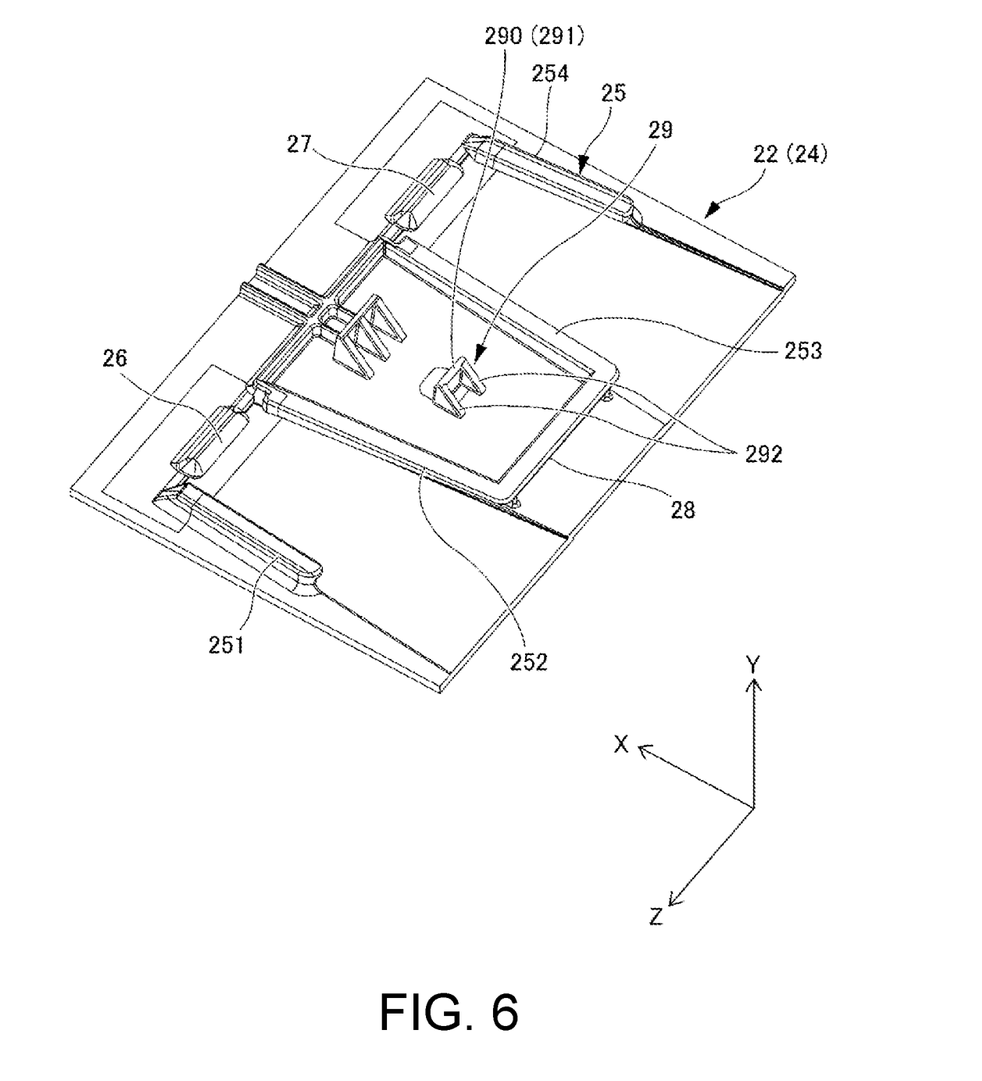
FIG. 6 is a perspective view illustrating a transport component-mounting section of a container body.

Next, a transport component-mounting section will be described. FIG. 6 is a perspective view illustrating the transport component-mounting section of the container body.

A transport component-mounting section 24 for mounting the transport component 30 thereon is integrally formed on the top surface 22 of the container body 20. Hence, the transport component-mounting section 24 is formed of the same molding material as the container body 20.

The transport component-mounting section 24 includes: a support rail 25 (an example of a first engaging portion) configured to restrict displacements of the transport component 30 in the top-bottom direction and the left-right direction in the mounted state; a first, second and third stopper 26, 27, 28 configured to restrict displacements of the transport component 30 in the forward direction in the mounted state; and a container body-side protrusion 29 (an example of a first protrusion) configured to restrict displacements of the transport component 30 in the rearward direction, in the mounted state.

The support rail 25 includes a first rail section 251, a second rail section 252, a third rail section 253 and a fourth rail section 254 that are formed on the top surface 22 of the container body 20 so as to extend in the front-rear direction and align in the left-right direction. The first rail section 251 supports an outer side surface portion of the left held plate 32 of the transport component 30. The second rail section 252 supports an inner side surface portion of the left held plate 32 of the transport component 30. The third rail section 253 supports an inner side surface portion of the right held plate 32 of the transport component 30. The fourth rail section 254 supports an outer side surface portion of the right held plate 32 of the transport component 30.

The first and second rail sections 251 and 252, and the third and fourth rail sections 253 and 254 are provided so as to incline such that the widths therebetween gradually become narrower as the rail sections 251 to 254 comes near the front side of the container body 20. The rail sections 251 to 254 are each formed so as to bend in a substantially L-shape in cross-section that rises from the top surface 22 to form an engagement groove between the rail sections and the top surface 22 of the container body 20 (see FIG. 7), and the rail sections 251 to 254 extend therefrom linearly in the front-rear direction. With such support rail 25, the outer and inner side surface portions of the pair of left and right held plates 32 of the transport component 30 are engaged and supported to prevent displacements of the transport component 30 at least in the top-bottom and left-right directions in the mounted state.

On the top surface 22 of the container body 20, the first stopper 26 is provided between the front ends of the first and second rail sections 251, 252 so as to extend in the left-right direction, and the second stopper 27 is provided between the front ends of the third and fourth rail sections 253, 254 so as to extend in the left-right direction. The first and second stoppers 26, 27 have a substantially L-shape in cross-section similar to that of the support rail 25. In the mounted state, the first and second stoppers 26, 27 are engaged with the front ends of the pair of left and right held plates 32 of the transport component 30, which restricts displacements of the transport component 30 at least in the forward direction.

The third stopper 28 is provided between the rear ends of the second and third rail sections 252, 253 on the top surface 22 of the container body 20 so as to extend in the left-right direction. The third stopper 28 have a substantially L-shape in cross-section similar to that of the support rail 25 (see FIG. 8). In the mounted state, the third stopper 28 is engaged with the rear end of the component main body 31 of the transport component 30, which restricts displacements of the transport component 30 at least in the forward direction.

The container body-side protrusion 29 is provided between the second rail section 252 and the third rail section 253 on the top surface 22 of the container body 20. The container body-side protrusion 29 is formed to protrude upward from the top surface 22 of the container body 20 so as to have a predetermined height H1. For example, the height H1 of the container body-side protrusion 29 is defined in the range of 6.5 mm to 10 mm.

The container body-side protrusion 29 has a plate-like shape extending in the left-right direction, and has a top portion 290 that is formed rounded as viewed in the left-right direction. Further, the container body-side protrusion 29 includes a protrusion main body 291 having a plate-like shape extending in the left-right direction, and a pair of left and right reinforcement ribs 292 extending rearward from the left and right ends of the protrusion main body 291. The pair of left and right reinforcement ribs 292 has a shape of a triangle as viewed in the left-right direction, and expands the coupling area between the protrusion main body 291 and the top surface 22 of the container body 20 to increase the collapse strength of the container body-side protrusion 29.

[How to Mount a Transport Component]

Figure 7:
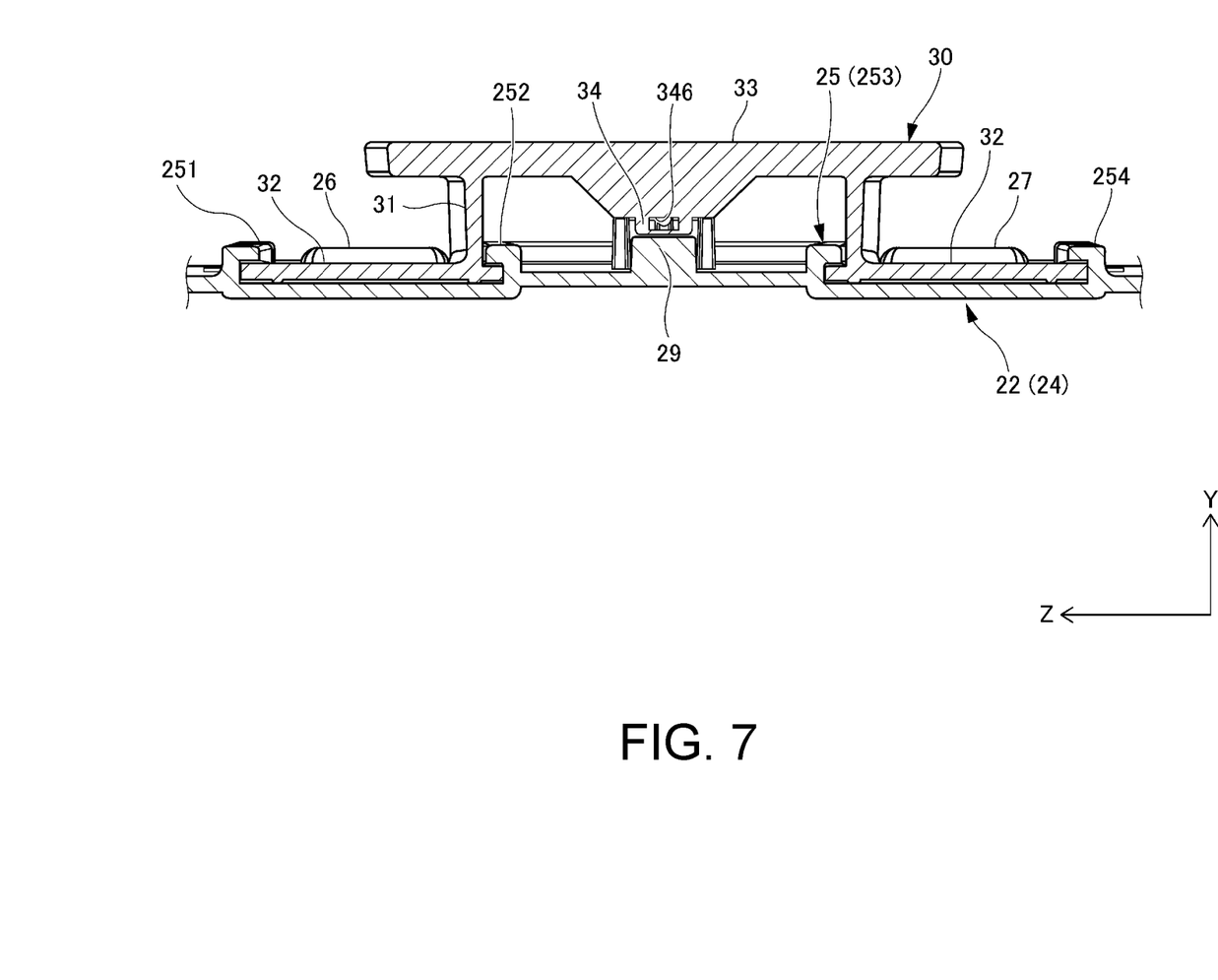
FIG. 7 is a partial cross-sectional view taken along the A-A line of FIG. 2 for explaining how to mount the transport component.
Figure 8:
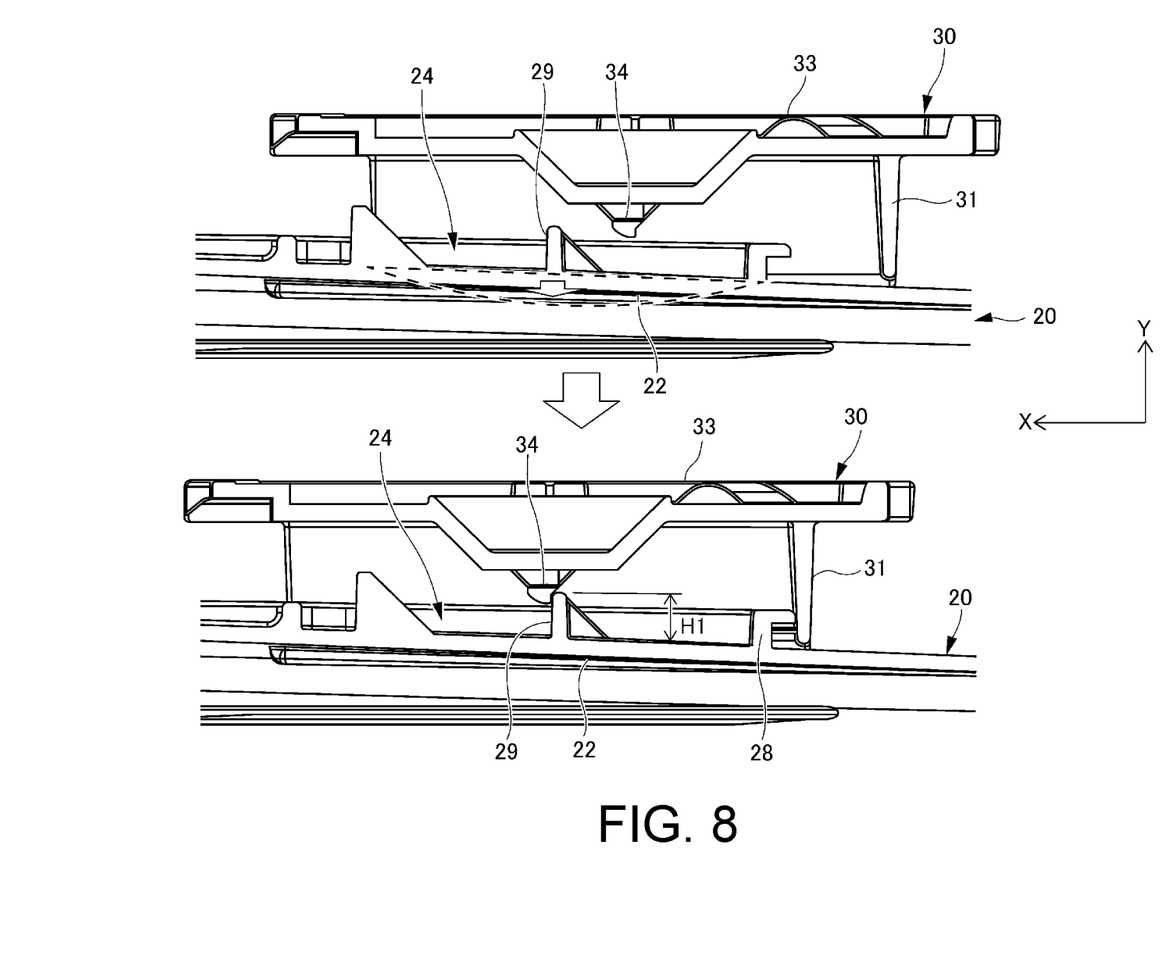
FIG. 8 is a partial cross-sectional view taken along the B-B line of FIG. 2 for explaining how to mount the transport component.

The way to mount the transport component will be described. FIG. 7 is a partial cross-sectional view taken along the A-A line of FIG. 2 for explaining how to mount the transport component. FIG. 8 is a partial cross-sectional view taken along the B-B line of FIG. 2 for explaining how to mount the transport component.

To mount the transport component 30 to the transport component-mounting section 24 of the container body 20, the transport component 30 is placed on the rear side of the top surface 22 of the container body 20. The held plates 32 of the transport component 30 are then slid from the rear side to the front side and inserted between the plurality of rail sections 251 to 254 constituting the support rail 25 of the transport component-mounting section 24. When the transport component 30 is inserted to a predetermined mounting position, all the side surface portions of the left and right held plates 32 are engaged and supported by the support rail 25, and the front ends of the held plates 32 and the rear end of the component main body 31 are engaged and supported by the stoppers 26 to 28. Thereby the transport component 30 in the mounted state is restricted from being displaced in the top-bottom, left-right and forward directions.

When the transport component 30 is slid forward from the rear side, the top portion 340 of the transport component-side protrusion 34 of the transport component 30 travels over the top portion 290 of the container body-side protrusion 29 of the transport component-mounting section 24, and the top portion 340 of the transport component-side protrusion 34 comes into engagement with the front side of the top portion 290 of the container body-side protrusion 29. Thereby the transport component 30 in the mounted state is also restricted from being displaced rearward.

In order for the top portion 340 of the transport component-side protrusion 34 of the transport component 30 to travel over the top portion 290 of the transport component-mounting section 24, at least one of the container body-side protrusion 29 and the transport component-side protrusion 34 needs to be elastically displaced in the top-bottom direction. In the substrate storage container 1 of the present disclosure, when a predetermined load is applied upward to the transport component-side protrusion 34, the transport component-side protrusion 34 is set to be displaced upward by a smaller amount than that of the downward displacement of the container body-side protrusion 29 when the same predetermined load is applied downward to the container body-side protrusion 29.

For example, in the substrate storage container 1 of the present embodiment, when a predetermined load is applied downward to the container body-side protrusion 29, an area around the container body-side protrusion 29 (a part of the top surface 22) is elastically deformed downward, which realizes a downward displacement of the container body-side protrusion 29. Further, the amount of the upward displacement of the transport component-side protrusion 34 when a predetermined load is applied upward to the transport component-side protrusion 34 is extremely small as compared with the amount of the downward displacement of the container body-side protrusion 29.

In such substrate storage container 1, the transport component 30 is mounted to the container body 20 by the engagement between the protrusions 29 and 34 instead of the engagement between an elastic engagement piece and a protrusion as in a conventional manner, thereby increasing the mounting force of the transport component 30. This can prevent the transport component 30 from being detached from the container body 20 due to an impact caused by a sudden stop or movement during the transport of the substrate storage container 1 or from being detached from the container body 20 during the handling by an operator.

In the mounted state as described above, the top portion 290 of the container body-side protrusion 29 and the top portion 340 of the transport component-side protrusion 34 overlap with each other in the range of 1.5 mm to 3.5 mm in the top-bottom direction. The reason thereof is that if the amount of overlapping in the top-bottom direction is less than 1.5 mm, it is not possible to achieve the required mounting force (the detachment load), while if the length exceeds 3.5 mm, the load required for mounting the transport component 30 (the mounting load) increases, which reduces the mounting capability of the transport component 30.

Further, as described above, since the height H1 of the container body-side protrusion 29 is defined in the range of 6.5 mm to 10 mm, the amount of overlapping in the top-bottom direction between the top portion 290 of the container body-side protrusion 29 and the top portion 340 of the transport component-side protrusion 34 can be optimized while the container body-side protrusion 29 can be prevented from being broken. Specifically, in the case where the height H1 of the container body-side protrusion 29 is less than 6.5 mm, the amount of overlapping in the top-bottom direction between the top portion 290 of the container body-side protrusion 29 and the top portion 340 of the transport component-side protrusion 34 may become small. In the case where the height H1 exceeds 10 mm, the strength of the container body-side protrusion 29 may become insufficient. Accordingly, the container body-side protrusion 29 may be broken during the mounting process, or the required engagement force may not be kept in the mounted state.

Further, as described above, the base portion 343 of the transport component-side protrusion 34 has the surface 354 on the front side with the angle $\theta 3$ in the range of 40° to 50° with respect to the top-bottom direction as well as the surface 345 on the rear side with the angle $\theta 4$ in the range of 40° to 50° with respect to the top-bottom direction as viewed in the left-right direction. Hence, the width in the front-rear direction of the base portion 343 becomes wider toward the upper side, thereby forming a trapezoidal shape superior in strength. Therefore, the transport component-side protrusion 34 can be prevented from being broken due to the load applied thereon during the mounting process, and the required engagement force can be kept in the mounted state.

Further, as described above, the top portion 340 of the transport component-side protrusion 34 has a triangular shape in which the side 341 on the front side has a larger inclination angle with respect to the top-bottom direction than that of the side 342 on the rear side in the mounted state as viewed in the left-right direction. Therefore, the top portion 340 of the transport component-side protrusion 34 can more easily travel over the top portion 290 of the container body-side protrusion 29, which can reduce the mounting load necessary in the mounting process and realize the required engagement force.

Further, as described above, when the inclination angle $\theta 1$ of the side 341 on the front side with respect to the top-bottom direction is in the range of 60° to 80°, the mounting load required in the mounting process can be reduced, and the container body-side protrusion 29 can be pushed downward by a predetermined amount (e.g., 1.5 mm to 3.5 mm).

Further, as described above, when the inclination angle $\theta 2$ of the side 342 on the rear side with respect to the top-bottom direction is in the range of 0° to 5°, the engagement force in the mounted state can be increased.

Incidentally, an experiment was conducted to see whether the transport component 30 mounted to the container body 20 would come off from the container body 20 when pushed to the rear side, and the results were compared between the substrate storage container 1 of this embodiment and the conventional one of Patent Literature 1. From the experiment, it was found that the substrate storage container 1 of the present disclosure additionally required a force of 1000N or more as compared with the conventional substrate storage container.

The embodiments of the disclosure have been described in detail above. However, the present disclosure is not limited to the specific embodiments, and various variations and modifications can be made within the scope of the description in the claims. It is also possible to combine all or some of the components of the embodiments described above.

REFERENCE SIGNS LIST

1: substrate storage container
10: lid
20: container body
21: opening
22: top surface
23: side surface
24: transport component-mounting section
25: support rail
251: first rail section
252: second rail section
253: third rail section
254: fourth rail section
26: first stopper
27: second stopper
28: third stopper
29: container body-side protrusion
290: top portion
291: protrusion main body
292: reinforcement rib
30: transport component
31: component main body
32: held plate
33: flange
330: concave portion
34: transport component-side protrusion
340: top portion
341: side
342: side
343: base portion
344: surface
345: surface
346: through hole
W: substrate

The invention claimed is:

1. A substrate storage container, comprising:
a main body, and
a transport component configured to be removably mountable to the main body, wherein
the main body has a surface having a first protrusion protruding from the surface and a first engaging portion,
the transport component has a surface having a second protrusion protruding from the surface and a second engaging portion,
the transport component is configured to be moved to a first side from a second side opposite to the first side in a first direction relative to the main body to be mounted to the main body,
in a mounted state in which the transport component is mounted to the main body, the surface of the transport component faces the surface of the main body in a second direction orthogonal to the first direction,
in the mounted state, the second engaging portion is engaged with the first engaging portion in the second direction to restrict a relative displacement between the main body and the transport component in the second direction,
in the mounted state, a top portion of the first protrusion overlaps a top portion of the second protrusion in the second direction, and the top portion of the second protrusion is positioned on the first side of the top portion of the first protrusion in the first direction such that the second protrusion is engaged with the first protrusion in the first direction to restrict a relative displacement of the transport component with respect to the main body to the second side in the first direction, and the first protrusion and the second protrusion are each displaced to an opposite side in the second direction when subjected to a predetermined load toward the opposite side in the second direction, and the second protrusion is displaced by a smaller amount than the first protrusion.

2. The substrate storage container according to claim 1, wherein
in the mounted state, the top portion of the first protrusion overlaps the top portion of the second protrusion in the second direction in a range of 1.5 mm to 3.5 mm.

3. The substrate storage container according to claim 1, wherein
the first protrusion has a triangular shape as viewed in a third direction orthogonal to both of the first direction and the second direction, and
the top portion of the second protrusion has a triangular shape as viewed in the third direction.

4. The substrate storage container according to claim 3, wherein
the triangular shape of the first protrusion has a side on the second side forming an inclination angle with respect to the second direction larger than that of a side on the first side in the mounted state as viewed in the third direction, and
the triangular shape of the top portion of the second protrusion has a side on the first side forming an inclination angle with respect to the second direction larger than that of a side on the second side in the mounted state as viewed in the third direction.

5. The substrate storage container according to claim 4, wherein the triangular shape of the top portion of the second protrusion has the side on the first side forming the inclination angle in a range of 60° to 80° in the mounted state as viewed in the third direction.

6. The substrate storage container according to claim 4, wherein the triangular shape of the top portion of the second protrusion has the side on the second side forming the inclination angle in a range of 0° to 5° in the mounted state as viewed in the third direction.

7. The substrate storage container according to claim 3, wherein the second protrusion has a base portion, and the base portion has surfaces inclined with respect to the second direction as viewed in the third direction.

8. The substrate storage container according to claim 7, wherein the surfaces of the base portion includes surface on the first side having an angle in a range of 40° to 50° with respect to the second direction; and surface on the second side having an angle in a range of 40° to 50° with respect to the second direction.

9. The substrate storage container according to claim 1, wherein the base portion of the second protrusion has a hole recessed in the first direction or a through hole penetrating therethrough in the first direction.

10. The substrate storage container according to claim 1, wherein the first protrusion has a height in a range of 6.5 mm to 10 mm.

11. The substrate storage container according to claim 1, wherein the main body is configured such that when comes into contact with the second protrusion and is subjected to a predetermined load in the second direction, an area around the first protrusion is elastically deformed to cause a displacement of the first protrusion in the second direction.

\* \* \* \* \*